(12) United States Patent
de Jesus et al.

(10) Patent No.: US 9,178,500 B2
(45) Date of Patent: Nov. 3, 2015

(54) SYSTEM AND METHOD FOR A HIGH SPEED, HIGH VOLTAGE PULSE POWER GENERATOR

(75) Inventors: Raymond A. de Jesus, Santa Clarita, CA (US); J. Patrick Roney, Palmdale, CA (US); Joshua Wiehn, Lancaster, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 901 days.

(21) Appl. No.: 13/353,295

(22) Filed: Jan. 18, 2012

(65) Prior Publication Data

US 2013/0181525 A1 Jul. 18, 2013

(51) Int. Cl.
| | |
|---|---|
| H03K 3/00 | (2006.01) |
| H03K 3/64 | (2006.01) |
| H03K 3/57 | (2006.01) |
| H02M 3/335 | (2006.01) |
| G05F 1/618 | (2006.01) |
| H02J 1/00 | (2006.01) |

(52) U.S. Cl.
CPC ............. *H03K 3/57* (2013.01); *H02M 3/335* (2013.01); *G05F 1/618* (2013.01); *H02J 1/00* (2013.01); *Y10T 307/50* (2015.04)

(58) Field of Classification Search
CPC ............. H03K 3/57; H03K 3/53; H03K 3/45; H03K 3/55; H03K 3/537; H02M 3/335; G05F 1/618; B64D 45/02; H03H 7/01; H05B 37/02
USPC ........... 307/106, 105, 43, 650; 363/21.13, 20, 363/39, 40; 333/181; 323/285; 331/172
See application file for complete search history.

(56) References Cited

U.S. PATENT DOCUMENTS

| | | | | |
|---|---|---|---|---|
| 5,499,178 | A  * | 3/1996 | Mohan | 363/39 |
| 7,613,017 | B1 * | 11/2009 | Diana et al. | 363/20 |
| 2005/0218423 | A1 | 10/2005 | Shimizu et al. | |
| 2008/0284276 | A1 | 11/2008 | McDonald | |
| 2009/0281736 | A1 | 11/2009 | Kim | |
| 2010/0188873 | A1 * | 7/2010 | Zheng et al. | 363/21.13 |
| 2011/0316511 | A1 * | 12/2011 | Wang et al. | 323/285 |
| 2012/0080944 | A1 * | 4/2012 | Recker et al. | 307/25 |
| 2012/0169433 | A1 * | 7/2012 | Mullins et al. | 333/181 |
| 2012/0280765 | A1 * | 11/2012 | Kurs et al. | 333/175 |

FOREIGN PATENT DOCUMENTS

| | | |
|---|---|---|
| CN | 201497808 U | 6/2010 |
| EP | 1 184 966 A1 | 3/2002 |

OTHER PUBLICATIONS

Sheng et al., "Design and Implementation of a High Power Density Three-Level Parallel Resonant Converter for Capacitor Charging Pulsed-Power Supply", IEEE Transactions on Plasma Science, Apr. 2011, pp. 1131-1140, vol. 39, Issue 4.

Berning et al., "Generalized Test Bed for High-Voltage, High Power SiC Device Characterization", 41st Industry Applications Conference (IAS) Annual Meeting, Oct. 2006, pp. 338-345.

* cited by examiner

*Primary Examiner* — Rexford Barnie
*Assistant Examiner* — Jagdeep Dhillon
(74) *Attorney, Agent, or Firm* — McDermott Will & Emery LLP

(57) ABSTRACT

A pulse generator system and method, including an inductive storage device configured to perform a charging process using a high current received from a first power supply; and a switch that is powered by a second power supply and configured to receive a step signal through a gate driver for controlling a repetition rate of the inductive storage device charging process and a pulse repetition frequency (PRF) of an output pulse.

20 Claims, 2 Drawing Sheets

SYSTEM AND METHOD FOR A HIGH SPEED, HIGH VOLTAGE PULSE POWER GENERATOR

STATEMENT REGARDING FEDERALLY SPONSORED RESEARCH OR DEVELOPMENT

Not Applicable.

FIELD OF INVENTION

The subject technology relates in general to pulse generators, and more particularly to, high-speed, high-voltage pulse generators.

BACKGROUND

Conventional pulse generators typically operate as capacitive energy storage devices, such that energy is stored based on the voltage drop across the plates of the capacitor to generate current. Class E circuits are typically used to create a sinusoidal output. Other conventional pulse generators typically use Pulse Forming Networks, Blumlein, and MOSFET switches. These systems generally use coax cables for charging. Other pulse generator systems are known to operate in burst-mode such that the system outputs a burst of pulses in response to a triggering event. However, the burst-mode systems operate as discontinuous pulses that can run at high frequencies.

The drawbacks of these conventional pulse generators are their inability to perform with the combinations of high pulse repetition frequency (PRF), high voltage output, continuous operation, and efficient handling of heat dissipation. Thus, there exists a need for a system that generates high voltage pulses continuously with high repetition rates while handling heat dissipation efficiently.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In an aspect of the disclosure, a pulse generator system is disclosed. The system includes an inductive storage device for performing a charging process using a high current received from a first power supply; and a switch that is powered by a second power supply and configured to receive a step signal through a gate driver for controlling a repetition rate of the inductive storage device charging process and a pulse repetition frequency (PRF) of an output pulse.

In another aspect of the disclosure, a multi-channel pulse generation system is disclosed. The system including a plurality of inductive storage devices for generating continuous high voltage pulses at a high pulse repetition frequency (PRF), the plurality of inductive storage devices receiving a high charging current from a common power supply; and a plurality of switches for transferring the generated high voltage pulses from the inductive storage devices to respective outputs, each of the plurality of switches being coupled to one of the plurality of inductive storage devices such that each inductive storage device is independently controlled.

In a further aspect of the disclosure, a method of generating a high voltage pulse is disclosed. The method including storing an inductive charge during a first mode of operation to generate a high voltage pulse; transferring the generated voltage pulse to an output load during a second mode of operation; and receiving a step signal that is logically gated to a voltage signal to toggle between the first and second modes of operation.

According to various aspects of the subject technology, embodiments may be directed to a high-speed, high-voltage variable pulse power generator. Embodiments of the subject technology address a need for providing a high output voltage pulse at a high frequency while eliminating system breakdown due to heat build up. Embodiments of the subject technology may include a Class-E approach in which adjustments can be implemented to improve efficiency in voltage generation. In an aspect, an inductive storage device can be used to generate a high voltage pulse. The inductive storage device can use current (e.g., a high charging current) to generate the high voltage pulse. In some embodiments of the subject technology, an inductor, coupled to a DC power supply, can be charged during a conducting state of a MOSFET switch. The MOSFET switch can be controlled by an external step generator. Once the inductor is fully charged, the inductor can rapidly produce a high-voltage pulse-shaped output draining directly into a 50 ohm resistive load or device under test (DUT). The pulse-shaped output can be manipulated by optimizing capacitor and inductor values in the signal line of the circuit. Additional manipulation of the output pulse can be applied by changing pulse shape variables on the external input trigger to the MOSFET switch. In some embodiments of the subject technology, the output pulse produces a pulse shape width of 7 nanoseconds or greater, a rise time between 20 to 30 nanoseconds, and a fall time between 3 to 4 nanoseconds with time of operation measured to last for more than two hours. Reflections from varying loads can be controlled by using a schottky diode and/or a transient voltage suppression (TVS) diode connected at the output of the MOSFET switch. Heat dissipation can be controlled by using a custom made heatsink and modifying the casing of the MOSFET switch.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

DETAILED DESCRIPTION

As previously discussed, there is a need for a system and/or methodology of generating high voltage pulses continuously with high switching speeds while handling heat dissipation efficiently.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Figure 1:
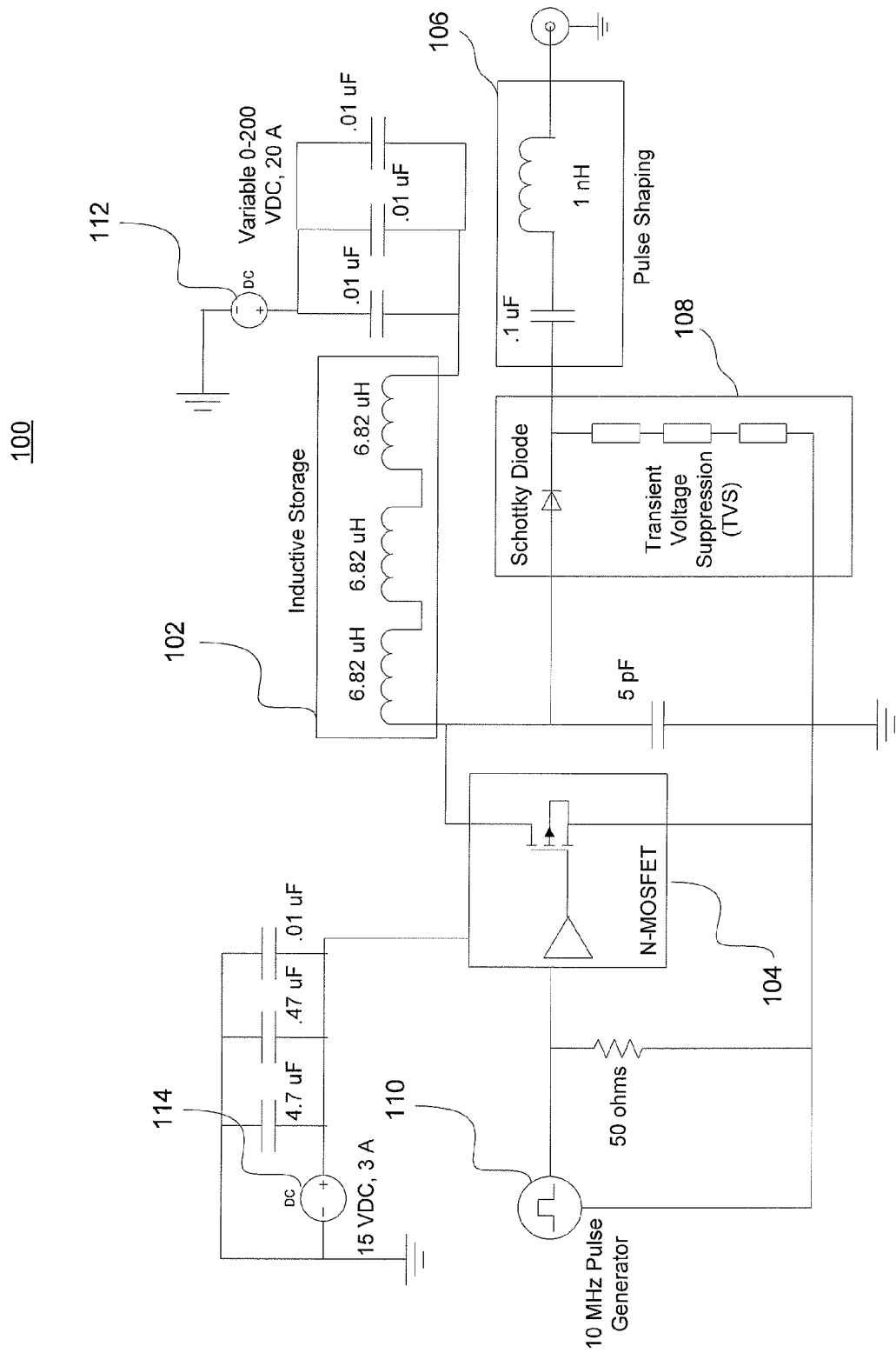
FIG. 1 is a schematic diagram illustrating an example of a pulse power generator system in accordance with an embodiment of the subject technology.

Referring now to FIG. 1, a pulse generator system 100 is illustrated in accordance with various embodiments of the subject technology. The system includes an inductive storage device 102, a gated switching circuit 104, a pulse shaping circuit 106, and an output protection circuit 108.

In various aspects of the subject technology, the pulse generator system 100 can be employed as a Class E approach in which the inductive storage device 102 can be rapidly charged during the closed (or conducting) mode operation of the gated switching circuit 104. Once the inductors of the inductive storage device 102 are fully charged, the gated switching circuit 104 switches to an open position and transfers a high voltage pulse to a load or device under test (DUT). This operation can be controlled by an external pulse generator 110 through the input of the gated switching circuit 104 (or gate node of a MOSFET) of which influences the timing of the pulse generator system 100, such as the pulse repetition frequency (PRF), the pulse width (PW), and the transition (e.g., rise/fall) times of the inductive storage charge/discharge operation. In some embodiments, the external step signal can be a square wave with a defined duty cycle and frequency. In some examples, the step signal frequency can vary between 1 and 10 megahertz (MHz). For purposes of this disclosure, it is assumed that the input step frequency is set to 10 MHz.

The inductive storage device 102 can be coupled to a DC power supply 112 through a plurality of bypass capacitors. The gated switching circuit 104 can also be coupled to a DC power supply 114 through a plurality of bypass capacitors. In various aspects, the bypass capacitors operate to dampen the AC component of the power supplies, thus reducing the presence of any ripple voltages on the power supply lines. The bypass capacitors can range from 0.01 micro-Farads to 4.7 micro-Farads, depending upon the amount of noise existing in the line.

In various aspects of the subject technology, the DC power supply 112 can provide variable voltage amplitudes ranging from 0 to 200 volts DC with a corresponding amperage of up to 20 amps. In other aspects of the subject technology, the DC power supply 114 can provide a fixed voltage of 15 volts DC with a corresponding amperage of 3 amps. In other embodiments, the DC power supply 114 can be a variable source.

In various aspects of the subject technology, the inductive storage device 102 can be implemented with multiple inductors connected in series. In an embodiment, the inductors can have similar inductive characteristics to each other, such as having the same inductance values. For example, each of the inductors of the inductive storage device 102 can be implemented with an inductance value of 6.82 micro-Henries. In another embodiment, each of the inductors can have a different inductance value. As such, the total circuit inductance through the inductive storage device can equal the sum of all the individual inductors added together. Accordingly, the total voltage drop across each inductor can be added with each inductor, thus, creating a greater total voltage for the same rate of change in current. In various embodiments, the inductances of the inductive storage device 102 can be adjusted to increase the output voltage value during discharge and, thus, the values discussed herein are merely exemplary.

In various aspects, the gated switching circuit 104 includes a MOS transistor ("MOSFET") configured to operate as a switch. That is, when the MOSFET is conducting, the switch is in a closed mode of operation. Alternatively, when the MOSFET is non-conducting, the switch is in an open mode of operation. In various embodiments, the MOSFET is an n-channel (i.e., NMOS) enhancement type transistor. In Class E operation, the MOSFET can be intentionally driven into saturation using a square wave input, for example. As a result, this can power on the MOSFET as quickly as possible. The gate input can be biased with at least 8 V to increase the likelihood of saturation, for example. By driving the MOSFET into saturation, it purposely avoids the linear region. Accordingly, the amount of wasted input power can be greatly reduced.

The pulse shaping circuit 106 can be configured to filter out unwanted ringing in the output signal. For example, additional pulse shaping capability can be provided by optimizing capacitor and inductor (LC) values in the signal line of the circuit. The output of the MOSFET switch can be coupled in series with an inductor and a capacitor. Values for each of these components can be selected to effect a proper impedance match to the output load.

In some embodiments, the output load can range between 50 to 100 ohms. For example, the output can be connected to a device under test using a low-loss transmission line (e.g., 50 ohm RG coaxial cable). In some embodiments, a series or shunt resistance can be implemented depending upon the load impedance of the pulse generator system 100. In other embodiments, a series or shunt resistance can be implemented to match the output impedance of the pulse generator system 100.

The output protection circuit 108 can be implemented to protect the pulse generator system 100 from unwanted reflections or voltage spikes. Reflection damage from varying loads can be controlled by inserting a Schottky diode at the output of the MOSFET switch. The diode prevents reflected voltages from destroying the MOSFET chip. For example, the Schottky diode can operate as a clamping diode circuit such that unwanted overshoot or undershoot voltage amplitudes can be clipped. The type of diode voltage used can be dependent upon the dielectric breakdown number of the MOSFET chip.

Moreover, further protection can be provided by installing a set of transient voltage suppression (TVS) devices that are connected in parallel to the load so that voltages and currents exceeding the breakdown values of the MOSFET can be suppressed. For example, the transient voltage suppression devices can be configured to react to sudden or momentary overvoltage conditions. In some embodiments, the transient voltage suppression device can include multiple suppression circuits electrically coupled in series. The suppression device can be electrically coupled between the drain and source of the MOSFET switch.

In various embodiments of the subject technology, the pulse generator system 100 can provide output amplitudes continuously variable from 0 to 800 volts into (50-100 ohm loads), pulse widths of 7 ns or greater that are referenced at the 90% edge, fall times of 3 to 4 ns, rise times of 20 to 30 ns, and repetition rates up to 10 MHz. In an embodiment, the pulse generator system 100 can output a voltage amplitude of 700 volts for a PRF range of 6 to 10 MHz. In another embodiment, the pulse generator system 100 can output a voltage amplitude of 800 volts for a PRF range of 1 to 5 MHz.

In aspects of the subject technology, the pulse generator system 100 can be implemented in low observable and counter low observable technologies. In other aspects of the subject technology, the pulse generator system 100 can be implemented in photonics and optical computing technologies. In yet other aspects of the subject technology, the pulse generator system 100 can be implemented in radar and active phased array technologies.

In an embodiment, the pulse generator system 100 can be manipulated to regulate heat buildup in the circuit. Since the pulse generator system 100 can accept high current to generate the high voltage pulse, proper cooling of the MOSFET chip and inductive storage may be desirable. The MOSFET chip can be cooled through a custom-design heat sink attached directly to a dielectric thermal pad, for example. In another aspect of the subject technology, the pulse generator system 100 can be additionally cooled by modifying a case that houses the MOSFET chip such that air flow runs inside the MOSFET casing. In some embodiments, the pulse generator system 100 and the above-described elements may be varied and are not limited to the functions, structures, configurations, implementations or examples provided.

Figure 2:
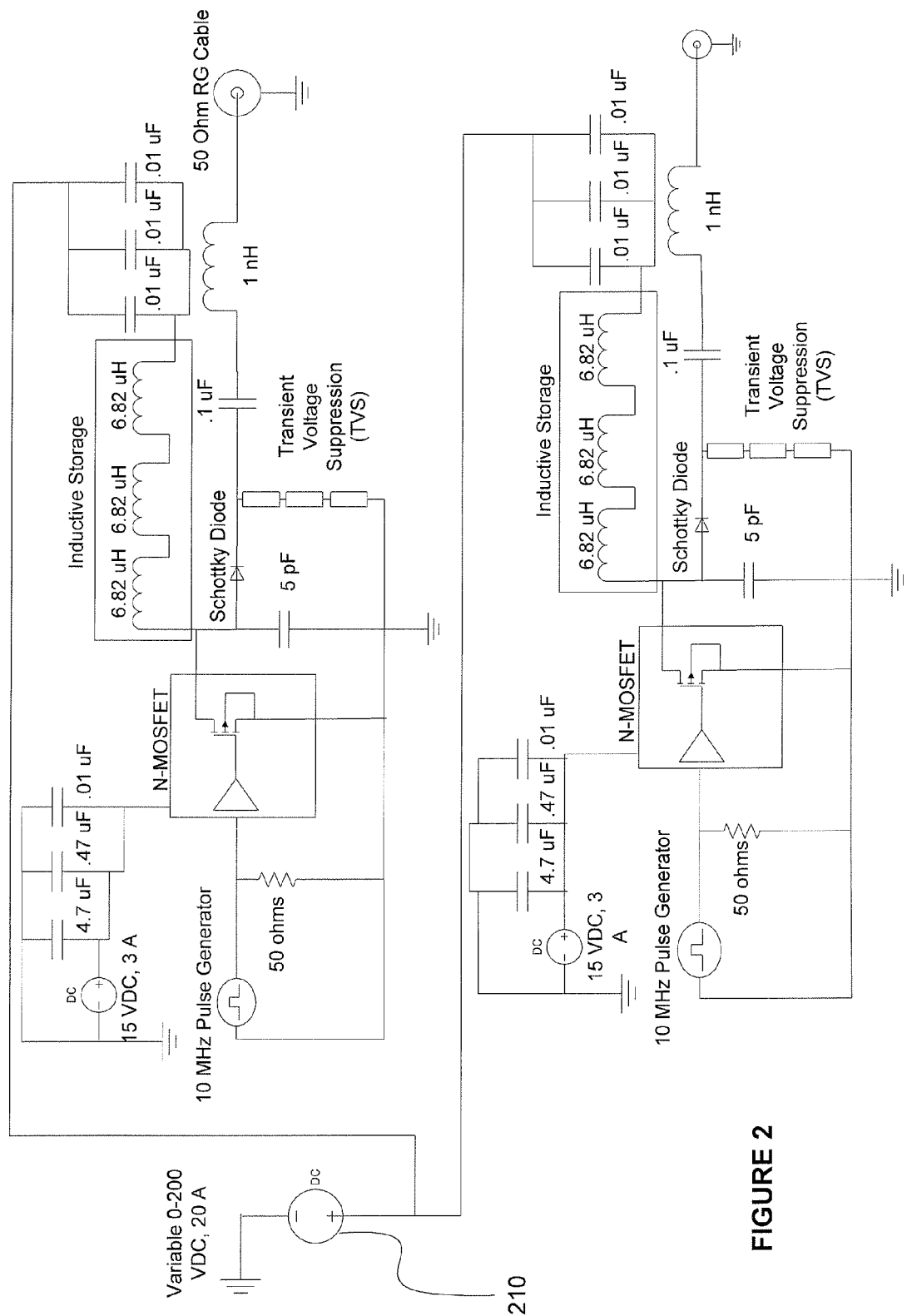
FIG. 2 is a schematic diagram illustrating an example of a multi-channel pulse power generator system in accordance with an embodiment of the subject technology.

FIG. 2 is a schematic diagram illustrating an example of a multi-channel configuration 200 using the pulse power generator system 100 in accordance with an embodiment of the subject technology. The single channeled design as discussed above with respect to FIG. 1 provides the flexibility and option of adding multiple independent channel outputs. The single channel design can permit multiple circuits to be combined with a common high voltage DC input 210 such that all channels are referenced to the same ground potential.

For example, FIG. 2 illustrates the ability of the pulse generator system 100 in accordance with an embodiment of the subject technology to allow a user to have more than one independent channel. The number of circuits and independent channels may be limited by the external DC current output. In an aspect, each circuit channel may have the option to be independently charged through individual external pulse generator control and LC circuit. In another aspect, each channel can be controlled by the same excitation. Each matching resistance value of each channel can be changed if the step signal is used to run multiple gate drivers. As such, the equivalent impedance should equate to seeing 50 ohms going into each gate driver. In some embodiments, the multi-channel configuration 200 and the above-described elements may be varied and are not limited to the functions, structures, configurations, implementations or examples provided.

The previous description is provided to enable any person skilled in the art to practice the various aspects described herein. The previous description provides various examples of the subject technology, and the subject technology is not limited to these examples. There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The claims herein are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention. Underlined and/or italicized headings and subheadings are used for convenience only, do not limit the subject technology, and are not referred to in connection with the interpretation of the description of the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa. The word "exemplary" is used herein to mean "serving as an example or illustration." Any aspect or design described herein as "exemplary" is not necessarily to be construed as preferred or advantageous over other aspects or designs.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A pulse generator system, comprising:
   an inductive storage device configured to perform a charging process using a high current received from a first power supply, wherein the inductive storage device comprises a first end and a second end;
   a switch powered by a second power supply and configured to receive a step signal through a gate driver for controlling a repetition rate of the inductive storage device charging process and a pulse repetition frequency (PRF) of an output pulse;
   a bypass capacitor, wherein the inductive storage device is connected with the switch on the first end and the bypass capacitor on the second end; and
   a pulse shaping circuit coupled between the switch and a load for shaping the output pulse, the pulse shaping circuit comprising an inductor and a capacitor connected in series, wherein the pulse shaping circuit is configured to shape the output pulse responsive to adjustments in values of the inductor and the capacitor.

2. The system of claim 1, wherein the switch is configured to toggle between open and closed modes of operation responsive to the step signal.

3. The system of claim 1, wherein the inductive storage device is configured to be charged during a closed mode operation of the switch.

4. The system of claim 1, wherein the switch is coupled to the second power supply through a second plurality of bypass capacitors.

5. The system of claim 1, wherein:
   the switch comprises an NMOS transistor,
   the inductive storage device is configured to be charged during a conducting state of the NMOS transistor, and
   the inductive storage device comprises a plurality of inductors connected in series.

6. The system of claim 1, further comprising:
   an output protection circuit configured to suppress an amount of overvoltage at an output of the switch during an open mode operation of the switch.

7. The system of claim 6, wherein the output protection circuit comprises:
   a plurality of transient voltage suppression devices configured to be electrically coupled in parallel to a load, and
   a Schottky diode configured to be electrically coupled to the output of the switch and the plurality of transient voltage suppression devices for reducing reflections.

8. A multi-channel pulse generation system, comprising:
   a plurality of inductive storage devices for generating continuous high voltage pulses at a high pulse repetition frequency (PRF), the plurality of inductive storage devices configured to receive a high charging current from a common power supply, wherein each of the plurality of inductive storage devices comprises a respective first end and a respective second end;
   a plurality of switches for transferring the generated continuous high voltage pulses from the inductive storage devices to respective outputs, each of the plurality of switches being coupled to a corresponding one of the plurality of inductive storage devices such that each inductive storage device is independently controlled;
   a plurality of bypass capacitors; and
   a pulse shaping circuit coupled between at least one of the plurality of switches and a load, the pulsed shaping circuit comprising an inductor and a capacitor connected in series, wherein the pulse shaping circuit is configured to shape an output pulse of the at least one of the plurality of switches responsive to adjustments in values of the inductor and the capacitor,
   wherein each of the plurality of inductive storage devices is coupled to a corresponding one of the plurality of switches on the respective first end and is coupled to at least one of the plurality of bypass capacitors on the respective second end.

9. The system of claim 8, wherein each of the plurality of switches is configured to receive a step signal independently that is logically gated to a voltage from an independent power supply such that a generated voltage pulse from the corresponding one of the plurality of inductive storage devices is transferred to an independent load.

10. A method of generating a high voltage pulse, the method comprising:
    coupling a direct current (DC) power supply to an inductive storage device through at least one bypass capacitor;
    storing an inductive charge in the inductive storage device during a first mode of operation to generate a high voltage pulse;
    transferring the generated high voltage pulse to an output load during a second mode of operation, wherein the transferring comprises:
       electrically coupling the generated high voltage pulse to a protection circuit for suppressing an amount of overvoltage;
       shaping an output of the protection circuit to generate a shaped voltage pulse; and
       transferring the shaped voltage pulse to the output load; and
    receiving a step signal that is logically gated to a voltage signal to toggle between the first and second modes of operation.

11. The method of claim 10, wherein:
    storing the inductive charge comprises receiving a high charging current from the DC power supply, and
    the DC power supply is a variable DC power supply.

12. The method of claim 10, wherein the shaping is responsive to adjustments in capacitor and inductor values at the output load.

13. The method of claim 10, further comprising:
suppressing an amount of overvoltage at the output load during the first mode of operation.

14. The method of claim 13, wherein suppressing the amount of overvoltage comprises electrically coupling a plurality of transient voltage suppression devices parallel to the output load.

15. The method of claim 10, further comprising:
electrically coupling another inductive storage device to the inductive storage device to produce multiple independent channels of generated voltage pulses,
wherein the received step signal is a continuous pulse of a defined frequency.

16. The method of claim 15, further comprising:
receiving another step signal at the another inductive storage device that is independent of the step signal received at the inductive storage device in order to generate voltage pulses in each channel independently.

17. The system of claim 1, further comprising:
a pulse shaping circuit configured to shape the output pulse; and
a protection circuit comprising one end and another end, the protection circuit being coupled to an output of the switch on the one end and the pulse shaping circuit on the another end, wherein the protection circuit is configured to suppress an amount of overvoltage at the output of the switch.

18. The system of claim 17, wherein the protection circuit comprises:
a plurality of transient voltage suppression devices; and
a diode with a first end and a second end,
wherein:
the first end of the diode is connected with the switch, and
the second end of the diode is connected with the pulse shaping circuit and at least one of the plurality of transient voltage suppression devices.

19. The system of claim 1, wherein the first power supply comprises a first direct current (DC) power supply and the second power supply comprises a second DC power supply.

20. The system of claim 1, further comprising a plurality of capacitors, wherein:
the bypass capacitor is one of the plurality of bypass capacitors, and
the inductive storage device is coupled to the first power supply through the plurality of bypass capacitors.

* * * * *